United States Patent [19]

Corry et al.

[11] Patent Number: 5,563,535
[45] Date of Patent: Oct. 8, 1996

[54] DIRECT DIGITAL FREQUENCY SYNTHESIZER USING SIGMA-DELTA TECHNIQUES

[75] Inventors: Alan Corry, Santa Clara; Robert A. Sutherland, San Jose, both of Calif.

[73] Assignee: MicroUnity Systems Engineering, Inc., Sunnyvale, Calif.

[21] Appl. No.: 350,131

[22] Filed: Nov. 29, 1994

[51] Int. Cl.$^6$ ............................................. H03B 21/00
[52] U.S. Cl. ..................... 327/105; 327/106; 327/159; 331/1 A; 331/16; 331/25; 341/118; 341/143
[58] Field of Search ...................... 327/105, 150, 327/159, 107, 106; 331/1 A, 17, 25, 16; 341/118, 143; 375/376

[56] References Cited

U.S. PATENT DOCUMENTS

| | | | |
|---|---|---|---|
| 3,654,450 | 4/1972 | Webb | 235/197 |
| 4,454,486 | 6/1984 | Hassun et al. | 332/16 R |
| 4,772,871 | 9/1988 | Suzuki et al. | 341/155 |
| 4,857,928 | 8/1989 | Gailus et al. | 341/143 |
| 4,972,360 | 11/1990 | Cuckler et al. | 364/724.04 |
| 4,999,625 | 3/1991 | Thompson | 341/118 |
| 5,038,117 | 8/1991 | Miller | 331/16 |
| 5,055,802 | 10/1991 | Hietala et al. | 331/16 |
| 5,084,702 | 1/1992 | Ribner | 341/143 |
| 5,164,727 | 11/1992 | Zakhor et al. | 341/143 |
| 5,181,032 | 1/1993 | Ribner | 341/143 |
| 5,220,326 | 6/1993 | Ledzius et al. | 341/118 |
| 5,225,787 | 7/1993 | Therssen | 328/15 |
| 5,243,344 | 9/1993 | Koulopoulos et al. | 341/143 |
| 5,243,345 | 9/1993 | Naus et al. | 341/143 |
| 5,245,344 | 9/1993 | Sooch | 341/150 |
| 5,305,004 | 4/1994 | Fattaruso | 341/120 |
| 5,311,181 | 5/1994 | Ferguson, Jr. et al. | 341/143 |
| 5,313,205 | 5/1994 | Wilson | 341/144 |

OTHER PUBLICATIONS

P. O'Leary and F. Maloberti, "A Direct–Digital Synthesizer with Improved Spectral Performance", *IEEE Transactions on Communications* vol. 39, No. 7, pp. 1046–1048 (Jul. 1991).

P. O'Leary et al., "Oversampling Data Conversion Applied to Data Modulation", *International Conference on Analog to Digital and Digital to Analogue Conversion*, pp. 124–129, 17–19 Sep. 1991 (Swansea UK, IEE London, UK 1991).

B. Miller, "Technique Enhances the Performance of PLL Synthesizers," *Microwaves & RF* pp. 59–65 (Jan. 1993).

*Primary Examiner*—Timothy P. Callahan
*Assistant Examiner*—Kenneth B. Wells
*Attorney, Agent, or Firm*—Burns, Doane, Swecker & Mathis

[57] ABSTRACT

A direct digital synthesizer (DDS) for generating a waveform generates a sequence of n-bit phase signals representing phase of the waveform, wherein n is an integer greater than zero. Each n-bit phase signal comprises a phase estimate signal and a phase error signal. The phase estimate signal comprises a most-significant m bits of the n-bit quantity (0 <m<n). The phase-error signal comprises a least-significant n–m bits of the n-bit quantity. The DDS further has a sigma-delta modulator for generating a compensation signal from the phase error signals. The phase estimate signal is added to the compensation signal to produce a compensated phase signal, which may be used to address a look-up table having waveform samples stored in correspondence with look-up table addresses. A digital to analog converter may be coupled to receive waveform samples from the look-up table in order to generate a corresponding analog waveform signal. In accordance with another aspect of the invention, an improved modulator includes the improved DDS as described above, for generating a stream of carrier signal samples; and a complex multiplier/accumulator (CMAC) for multiplying a stream of the carrier signal samples by a stream of complex data values that represent a baseband signal. The output of the CMAC is a stream of modulated carrier signal samples that may be supplied to a digital to analog converter which generates a corresponding analog modulated carrier signal.

14 Claims, 3 Drawing Sheets

DIRECT DIGITAL FREQUENCY SYNTHESIZER USING SIGMA-DELTA TECHNIQUES

BACKGROUND

The present invention relates generally to direct digital synthesizers, and more particularly to direct digital synthesizers employing noise shaping to reduce phase truncation noise.

Frequency synthesizers are known in the art. These devices typically generate waveforms (such as a sine wave, square wave, triangle, and the like) that are selectable over a wide frequency range and yet maintain high accuracy and frequency stability. Indirect synthesis methods typically employ a voltage-controlled oscillator (VCO) that is part of a phase-locked loop (PLL). A selectable frequency divider is set to provide the desired ratio between the output frequency and the crystal reference frequency. The output of the frequency divider is fed to one input of a phase detector, while the other input receives the output from the crystal reference frequency. The output of the phase detector is used to control the VCO. Fractional frequency division can be obtained by dynamically selecting the division ratio to alternate between values N and N+1 for suitable time intervals so that the average ratio is the desired fraction.

Direct digital synthesis of waveforms utilizes a different technique for generating a desired output. As illustrated in FIG. 1(a), a conventional direct digital synthesizer (DDS) 100 employs a phase accumulator 101 and a look-up table (LUT) 103. The accumulator 101 has an n-bit output which is incremented by a phase increment 105 with each assertion of the clock input 107. The LUT 103 may be, for example, a read only memory (ROM) having $2^m$ k-bit wide storage locations into which have been stored corresponding sample values of the waveform to be generated. It is assumed, throughout this entire specification, that the number of stored samples is greater than the minimum number that would be necessary to generate the desired frequency, so that all of the devices described herein operate in an oversampled environment. The addresses for the LUT 103 are supplied by the m most significant bits of the n-bit output of the accumulator 101. The output of the LUT 103 is supplied to a digital to analog converter (DAC) 109, whose output is the desired analog waveform having a frequency that is a function of the clock frequency ($f_{clk}$) as well as the phase increment 105.

The conventional DDS 100 suffers from the introduction of noise at two places. First, because the output of the LUT 103 is a finite width, a quantization error, $e_k$, is introduced. A second error, $e_p$, is introduced as a result of the truncation of the n-bit phase word to only m-bits for use in addressing the LUT 103. As described, for example, in P. O'Leary and F Maloberti, "A Direct-Digital Synthesizer with Improved Spectral Performance", *IEEE Transactions On Communications* Vol. 39, No. 7, pp. 1046–48 (July 1991), the entire text of which is incorporated herein by reference, the output of the DDS 100 is given by the following equation:

$$Out(t) = \sin\left(\frac{2\pi f_{gen} i}{2^m} + e_p(i)\right) + e_k(i)$$

$$= \sin\left(\frac{2\pi f_{gen} i}{2^m}\right) + e_p(i)\cos\left(\frac{2\pi f_{gen} i}{2^m}\right) + e_k(i)$$

where:

$f_{gen}$ is the generated frequency;

$e_p(i)$ is the error associated with the phase truncation from n bits at the accumulator 101 and m address bits at the LUT 103; and $e_k(i)$ is the quantization error due to the finite LUT data word (k bits).

As further described in P. O'Leary et al. "Oversampling Data Conversion Applied to Data Modulation", *International Conference on Analogue to Digital and Digital to Analog Conversion* pp. 124–129, 17–19 September 1991 (Swansea UK, IEE London, UK 1991), the text of which is incorporated herein by reference, it has been necessary to dimension the LUT 103 with an address bus one bit wider than the data bus, to ensure that the output error is dominated by the LUT data width and not by the address truncation. For high precision sine waves, this requires a very large LUT 103, because the LUT size increases exponentially in powers of 2 with the address width but only linearly in the number of data bits.

To overcome this disadvantage, O'Leary and Maloberti observe that the truncation of the n phase bits to m bits for use as a LUT address corresponds to quantization, and that if the frequency being generated is low with respect to the used clock frequency, then there is an intrinsic oversampling. Thus, they disclose the use of a noise shaping technique, shown in FIG. 1(b), to reduce the effects of the phase truncation. The noise shaper 115 comprises an m-bit wide adder 111 and a clocked register 113 coupled together to form a second accumulator. The m-bit output of the phase accumulator 101 is supplied as one input to the adder 111. The most significant p bits of the adder 111 are supplied as an address to the LUT 103. The remaining m–p bits from the output of the adder 111 are clocked into the register 113, the output of which is fed back to the second input of the adder 111. As a result of this arrangement, the phase error resulting from phase truncation is accumulated, and used to correct the LUT address, in what amounts to linear (first-order) noise shaping. O'Leary and Maloberti state that a quadratic interpolation between two consecutive LUT addresses could alternatively be used. In either case, however, the O'Leary technique operates to increase noise suppression around the carrier frequency without significantly increasing the bandwidth of noise suppression. It would be desirable to increase the noise suppression bandwidth in order to allow more information to be conveyed for a given signal-to-noise ratio (S/N), and also to facilitate anti-alias filtering.

It is a further goal, in DDS design, to reduce the size of the DAC 109 so that it will operate at higher speeds without sacrificing output accuracy. However, in conventional practice there is a tradeoff between quantization accuracy and speed of operation. Thus, operation at higher speeds has required a smaller quantization. The O'Leary technique fails to address this problem as well.

DDS's are frequently used in the field of communications. One such use is in the area of modulation. It is well known that different "channels" of information can be carried simultaneously in the radio frequency spectrum through the use of Frequency Division Multiple Access (FDMA), whereby each baseband signal (representing the desired information to be communicated) is superimposed onto (i.e., modulates) a particular one of a number of higher frequency carrier signals. The modulated carrier signal can then be transmitted over a medium (e.g., coaxial cable, wires, space) that is simultaneously conveying other modulated signals having different carrier frequencies. Any number of different modulation techniques can be used, all of which can be generally described by means of a complex baseband signal.

To perform the modulation, two different approaches can be taken. The traditional approach is to utilize analog circuitry that causes the baseband signal to modulate the carrier frequency in accordance with the selected modulation technique. An alternative approach is to convert (or otherwise construct) the baseband signal into a digitized stream of complex baseband data, multiply by complex carrier signal data, and then convert the in-phase (or antiphase) sum of the products into an analog signal.

Either of the above two methods allows the construction of complex spectral outputs, but the digital (i.e., second) approach allows software control of the modulation. Software is advantageous because it can be modified at low relative cost. Both approaches, however, produce outputs containing the product of noise powers present in both the carrier and data inputs. Thus, where the digital method of modulation has been used, it has been necessary to use larger DACs than would otherwise be desirable, in order to reduce the amount of noise that shows up in the modulated signal.

SUMMARY

It is therefore an object of the present invention to provide an improved technique for performing direct digital synthesis of waveforms, so that for a desired level of accuracy, a DAC may be used that is smaller than those that would be required using conventional techniques.

It is another object of the present invention to provide an improved digital modulation technique that permits the use of smaller-sized data values without sacrificing accuracy in the desired modulated signal.

In accordance with one aspect of the present invention, the foregoing and other objects are achieved in a direct digital synthesizer for generating a waveform, comprising means for generating a sequence of n-bit phase signals representing phase of the waveform, wherein n is an integer greater than zero. Each n-bit phase signal comprises a phase estimate signal and a phase error signal, the phase estimate signal comprising a most-significant m bits of the n-bit quantity (0<m<n) and the phase-error signal comprising a least-significant n−m bits of the n-bit quantity. In one embodiment of the invention, the sequence generating means is an n-bit accumulator, having one input coupled to receive a phase increment signal. The output of the accumulator is an n-bit value, the most significant m bits of which constitute the phase estimate signal, and the least significant n−m bits of which are the phase-error signal.

The DDS further includes a sigma-delta modulator for generating a compensation signal from the phase error signals. The phase estimate signal is then added to the compensation signal to produce a compensated phase signal which is then supplied to means for providing a waveform sample in correspondence with the compensated phase signal. The waveform sample providing means may be, for example, a look-up table having waveform samples stored in correspondence with look-up table addresses, and the compensated phase signal may be utilized as an address for accessing the look-up table. The output of the look-up table may be supplied to a digital to analog converter (DAC) for generating an analog waveform signal.

In accordance with another aspect of the invention, an improved modulator for modulating a carrier signal with a baseband signal comprises an improved DDS, as described above, which is used to generate carrier signal samples. That is, the look-up table supplies samples of the carrier signal to be modulated by the baseband signal. The improved modulator further includes means for receiving a stream of complex data values that represent the baseband signal. The carrier signal samples and the stream of complex baseband data values are supplied to respective inputs of a complex multiplier/accumulator (CMAC), the output of which is a stream of modulated carrier signal samples. These modulated carrier signal samples may be supplied to a digital to analog converter to produce a corresponding analog modulated carrier signal.

Because of the improvement in signal to noise ratio that results from the use of a compensated phase signal as described above, the modulator may utilize smaller and simpler CMAC and DAC devices than would otherwise be required to achieve a given performance level.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENTS

Figure 1A:
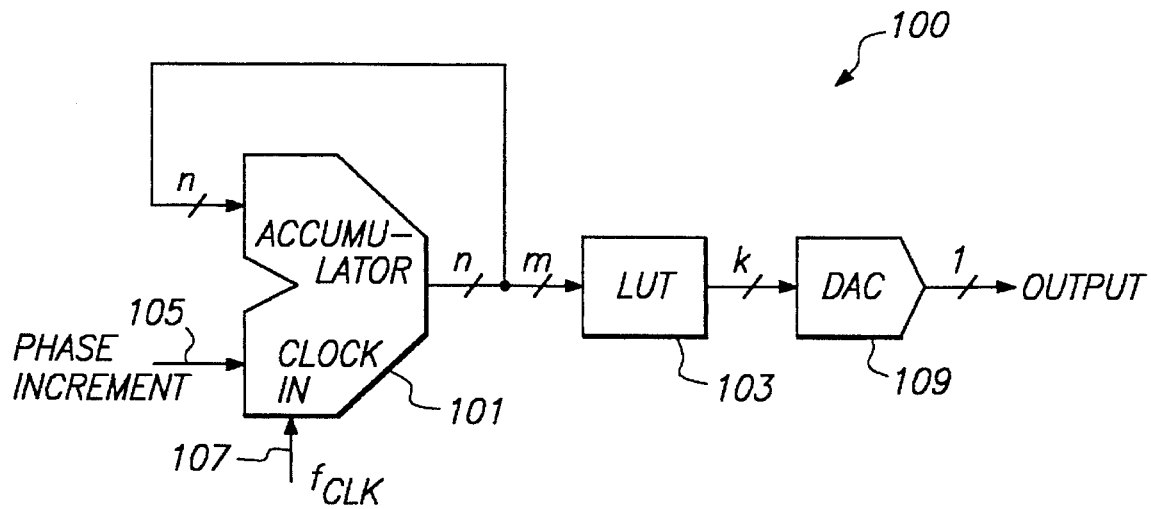
FIGS. 1(a) and 1(b) are respective block diagrams of a conventional direct digital synthesizer, and a prior art technique for reducing the effects of phase truncation in such a device.
Figure 1B:
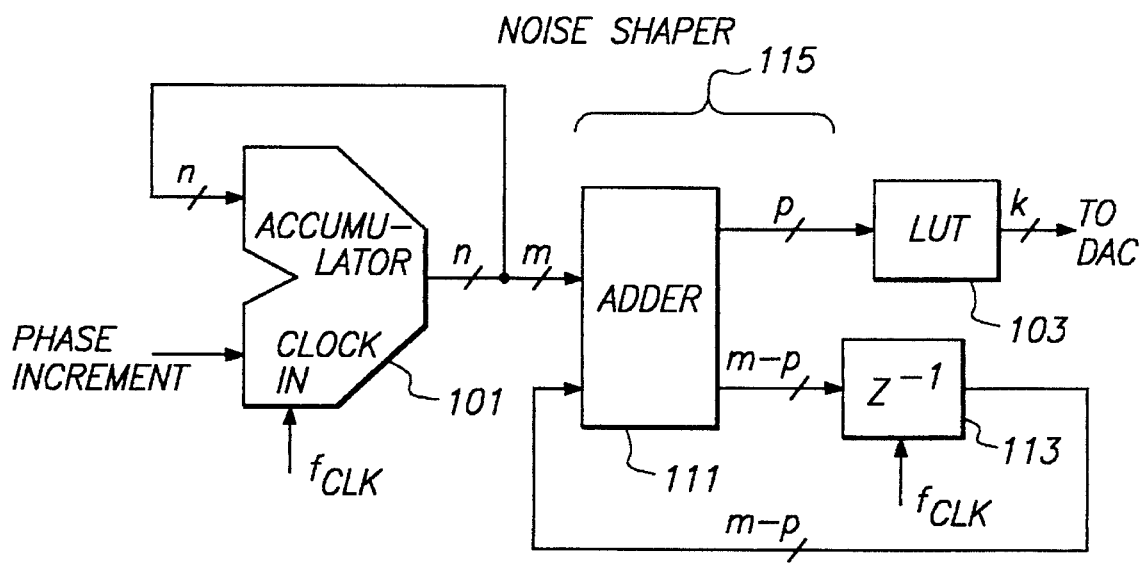
Figure 2:
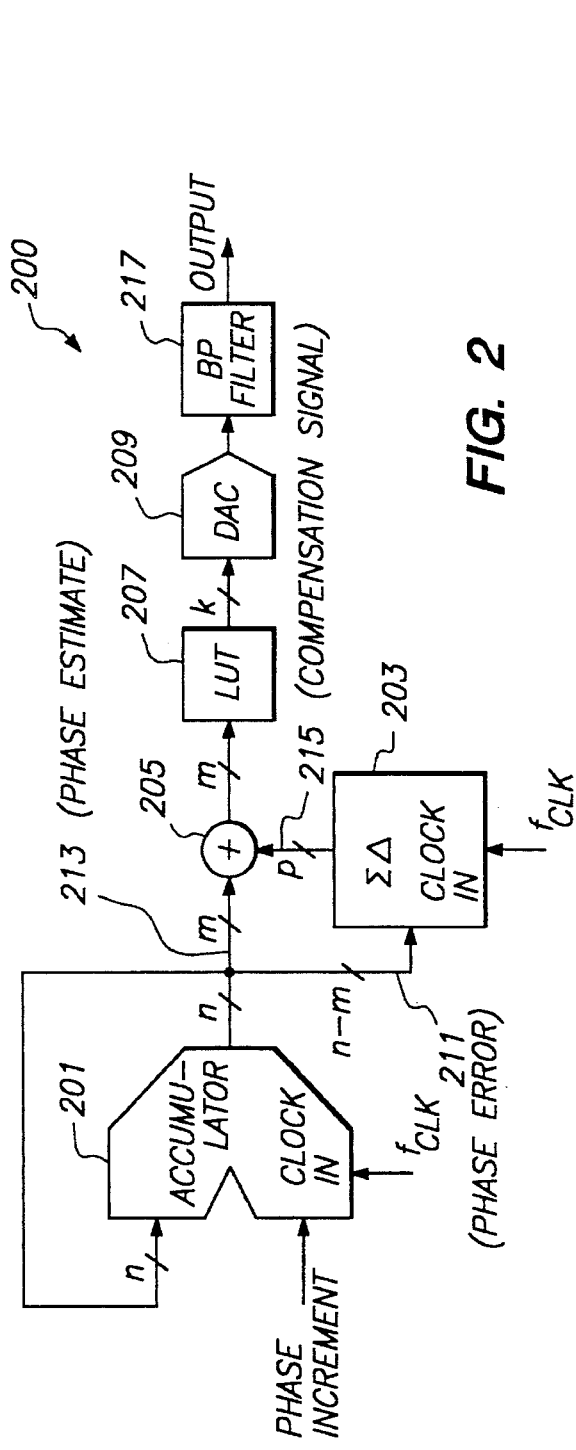
FIG. 2 is a block diagram of an embodiment of an improved direct digital synthesizer in accordance with the present invention.

Referring to the drawings, FIG. 2 shows a preferred embodiment of a DDS 200 in accordance with the present invention. An advantage of this arrangement is that it permits the use of a smaller DAC without sacrificing performance when operating in a highly oversampled environment. Additionally, as will be described in greater detail further below, functions normally performed in the analog domain can be performed digitally with no loss of performance.

Normally, a DAC running at Nyquist sampling rates has a noise floor (power density) that is set by the size of the DAC (i.e., the number of bits that constitute the quantized waveform samples). However in the present invention, the sampling rate is increased without changing the data bandwidth (i.e., oversampling is performed), so that the noise density is decreased by the oversampling ratio, and excess noise can be filtered out by an anti-alias filter. In accordance with the present invention, the oversampling is further utilized to simplify the filtering requirement by applying sigma-delta techniques to band-shape the noise (attributable to the phase truncation error, $e_p(i)$) away from a narrow band of interest, which in this case is a narrow band surrounding the sinusoidal signal being generated. Sigma-delta modulation is well known in the art. A general discussion of sigma-delta modulation may be found in U.S. Pat. No. 5,311,181 to Ferguson, Jr. et al., which is incorporated herein by reference. A discussion of the use of sigma-delta modulators to improve the performance of phase-locked loop synthesizers is presented in B. Miller, "Technique Enhances the Performance of PLL Synthesizers," Microwaves & RF p.59 (January 1993) and in U.S. Pat. No. 5,038,117 to Miller. The texts of both of these documents are incorporated herein by reference.

In general, sigma-delta modulation techniques require that an error signal be generated that represents the difference between an actual signal and an estimate of that actual signal. The error signal is then fed back to modify the next estimate so as to reduce the error.

As shown in FIG. 2, an accumulator 201 generates an n-bit quantity representing the instantaneous phase of the waveform to be generated. However, the LUT 207 has an address space that requires only an m-bit address (m<n). Thus, the m most-significant bits of the n-bit phase value represent an inexact estimate 213 of the phase value. It is also apparent that the unused n−m least-significant bits represent a phase error signal 211. In accordance with the present invention, this phase error signal 211 is supplied to the input of a sigma-delta modulator 203, which produces a compensation signal 215, having a width of p bits. As an example of the types of signals that are used in the present invention, n may be 28 bits, m may be 8 bits (so that the phase error signal 211 is $n-m=20$ bits wide), and p may equal 3 bits for a third order sigma-delta modulator 203.

The noise shaping that is performed by the sigma-delta modulator is consistent with traditional low-pass structures. The phase estimate signal 213 and the compensation signal 215 are supplied to respective inputs of an adder 205. The output of the adder is an m-bit value that represents a compensated phase signal, and which is applied directly to the address input of the LUT 207. The k-bit output of the LUT 207 is then applied to the input of a DAC 209, which converts the retrieved samples into an analog waveform that is made available at its output. The output of the DAC 209 may be supplied to a bandpass filter 217 that performs an anti-alias function as well as reduces the excess noise outside a band of interest.

It is important to realize that the DAC 209 is effectively dithered by the modification of the output of the LUT 207 so that in addition to the signal-to-noise ratio (SNR) improvement that results from oversampling, further improvement is achieved from the noise shaping. As a consequence of this further improvement, a less expensive, simpler DAC can be used in high performance applications.

Figure 3:
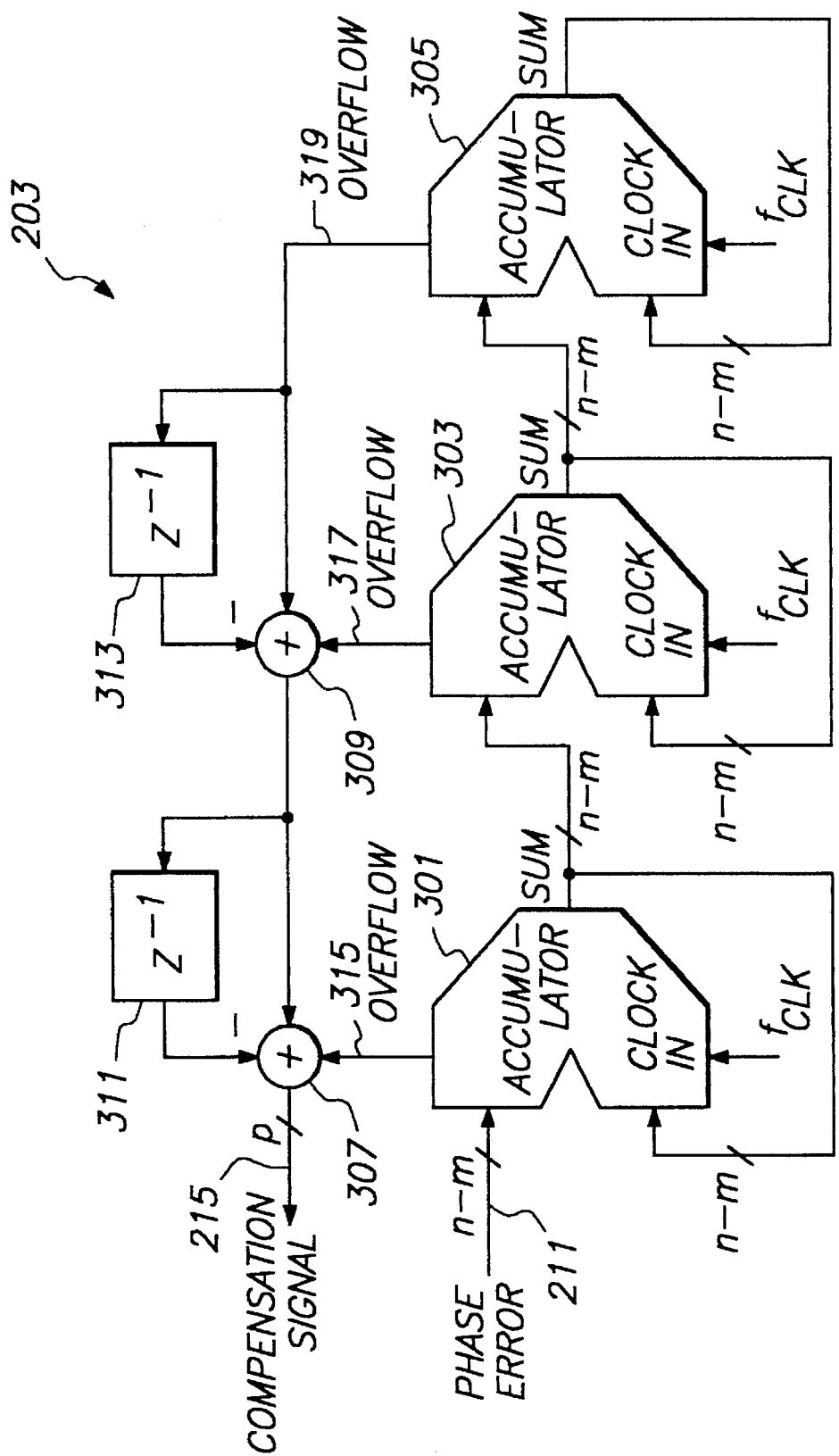
FIG. 3 is a block diagram of a preferred embodiment of the sigma-delta modulator for use in the inventive direct digital synthesizer.

Referring now to FIG. 3, a preferred embodiment of the sigma-delta modulator 203 is shown. It can be seen that the preferred embodiment utilizes a third-order modulator. However, the invention is not limited to this embodiment, and will also function with higher or lower orders of modulation, so long as at least second order sigma-delta modulation is performed. As can be seen in the figure, the phase error signal 211 is received by a first input of a first accumulator 301. The other input of the first accumulator receives the SUM output of the first accumulator 301. (Since each of the accumulators 301–305 is clocked, each of the SUM outputs represents the sum of the inputs presented to the respective accumulator during the immediately preceding clock cycle.) The output of the first accumulator 301 is also supplied to a first input of a second accumulator 303, whose SUM output is similarly wrapped around to a second input of the second accumulator 303. The SUM output of the second accumulator is also supplied to a first input of a third accumulator 305. The SUM output of the third accumulator 305 is wrapped around to a second input of the third accumulator 305. Thus, the first, second and third accumulators 301–305 calculate, respectively, the first, second and third integrals of the incoming phase error 211. In a preferred embodiment, the width of the sum outputs of the first, second and third accumulators 301–303 is equal to the width of their respective inputs. This is illustrated in FIG. 3 by having all accumulator inputs and sum outputs being n−m bits wide, which coincides with the width of the phase error signal 211.

In order to generate the compensation signal 215, each of the accumulators 301–305 further generates a corresponding overflow signal 315–319. The third overflow signal 319 is supplied to an input of a first summing device 309, and also to an input of a first unit delay device 313, such as a register that is clocked with the same signal that clocks each of the accumulators 301–305. The second overflow signal 317 is supplied to another input of the first summing device 309. A third (subtracting) input of the first summing device 309 receives the output of the first unit delay device 313.

The output of the first summing device 309 is supplied to an input of a second summing device 307, and also to an input of a second unit delay device 311. The first overflow signal 315 is supplied to a second input of the second summing device 307. The output of the second unit delay device 311 is supplied to a subtracting input of the second summing device 307. The output of the second summing device 307 is the compensation signal 215, which is p bits wide. For the third-order sigma-delta modulator illustrated in FIG. 3, p equals 3. (This follows from the fact that each of the first, second and third accumulators 301–305 generates a 1-bit overflow signal 315–319.)

The sigma-delta modulator 203 operates to noise shape the phase error 211 so that the compensation signal 215 (output from the sigma-delta modulator 203) is proportional to the integrated phase error 211. A large accumulated error implies a significant low frequency error, so that the correction to the LUT 207 will be correspondingly large. Conversely, a small accumulated error implies a mostly high-frequency error, so that each correction to the LUT 207 will be correspondingly small, but will occur with greater frequency. Continuity is assured by having a 3-bit dynamic range that can give instantaneous compensation of up to +/−3 LUT offsets, while simultaneously pulse width modulating the actual time spent at those offsets depending on the accumulated phase error.

Figure 4:
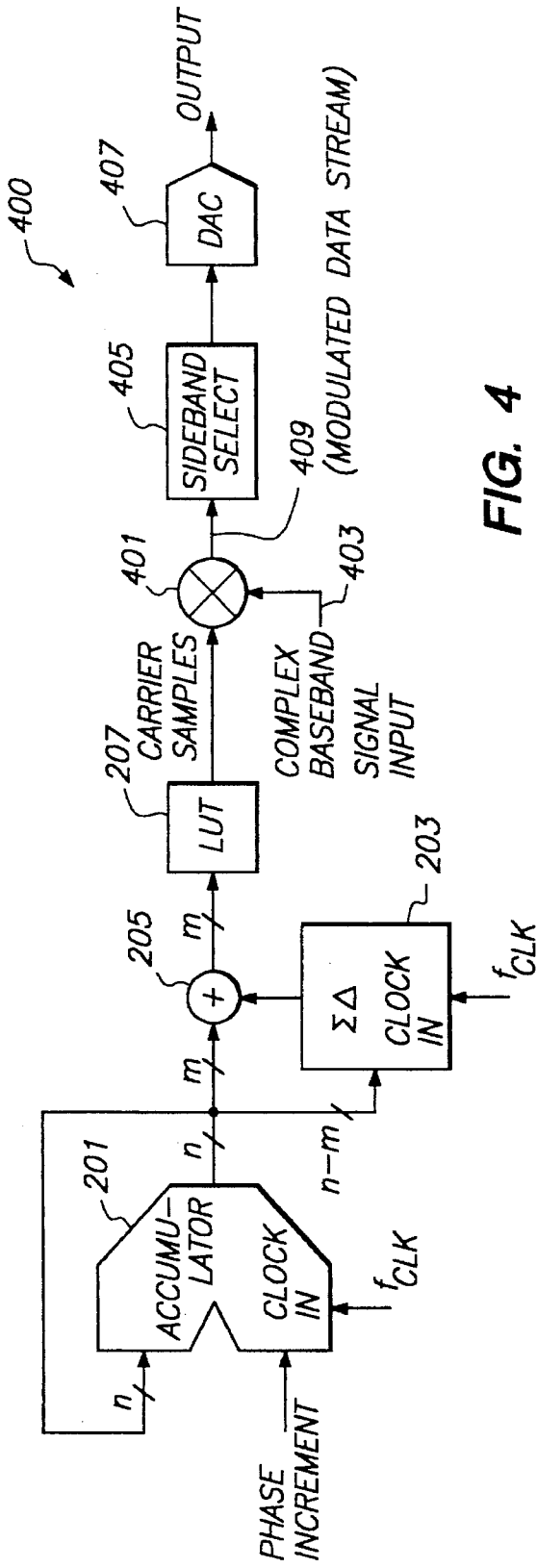
FIG. 4 is a block diagram of an improved circuit for modulating a baseband signal in accordance with another aspect of the invention.

In accordance with another aspect of the invention, an improved circuit for modulating a baseband signal will now be described with reference to FIG. 4. An accumulator 201, a sigma-delta modulator 203, an adder 205 and a LUT 207 are connected together and operated as described above with respect to FIG. 2. However, in the improved modulator 400, the output of the LUT 207 is supplied to one input of a digital complex multiplier/accumulator (CMAC) 401.

In a parallel data path, a complex digital baseband signal 403 is supplied to a second input of the CMAC 401. The output 409 of the CMAC 401, which is a stream of data representing the two quadrature phase components of the complex product (i.e., the modulated data stream), is then supplied to a sideband select circuit 405 that generates the upper (or lower) sideband by combining the two quadrature components in-phase (anti-phase). The output of the sideband select circuit 405 is then supplied to a DAC 407 for conversion into the desired modulated analog signal. (It should be noted that the terms upper-and lower-sideband are somewhat misleading as the inference that only a sideband is produced is incorrect, and in that the true outputs are spectral mirror images centered in the same carrier frequency. The method of combination and the spectral content of the baseband information determine which image appears in the output.)

The improved modulator 400 exhibits several advantages over previous techniques. First, since the data representing the carrier signal is oversampled, there is an SNR gain due to the reduction of data bandwidth compared to the sampling bandwidth. (When using digitized data, the noise power density is 20 log(N), where N is the quantization order.) Furthermore, using sigma-delta techniques to "noise shape" the carrier (i.e., move the low frequency noise to higher frequencies) and then modulating (mixing) digitally in a narrow bandwidth around the carrier frequency permits the removal of 6 db of noise that is attributable to the carrier quantization noise. This is equivalent to an extra 1 ½ bits of effective quantization. For example, if the modulated data stream 409 that is supplied by the CMAC 401 to the sideband select circuit 405 and subsequently to the DAC 407 is 8-bits wide, the SNR of the output of the DAC 407 is the same as would be achieved without the noise shaping but with a 9 ½ bit input value. Consequently, the DAC 407 may be made simpler and less expensive.

The invention has been described with reference to a particular embodiment. However, it will be readily apparent to those skilled in the art that it is possible to embody the invention in specific forms other than those of the preferred embodiment described above. This may be done without departing from the spirit of the invention. For example, the variously illustrated components may be implemented directly in hardware, or they may represent software solutions running on a processing device.

The preferred embodiment is, therefore, merely illustrative and should not be considered restrictive in any way. The scope of the invention is given by the appended claims, rather than the preceding description, and all variations and equivalents which fall within the range of the claims are intended to be embraced therein.

What is claimed is:

1. A direct digital synthesizer for generating a waveform, comprising:

means for generating a sequence of n-bit phase signals representing phase of the waveform, wherein n is an integer greater than zero, and each n-bit phase signal comprises a phase estimate signal and a phase error signal, the phase estimate signal comprising a most-significant m bits of the n-bit quantity, wherein m is an integer greater than zero and less than n, and the phase-error signal comprising a least-significant n−m bits of the n-bit quantity;

a sigma-delta modulator for generating a compensation signal from the phase error signals, wherein the sigma-delta modulator performs at least second order sigma-delta modulation of the phase error signals;

means for adding the phase estimate signal to the compensation signal and producing therefrom a compensated phase signal; and means, coupled to the adding means, for providing a waveform sample in correspondence with the compensated phase signal.

2. The direct digital synthesizer of claim 1, further comprising a digital to analog converter, coupled to receive the waveform sample and producing therefrom a corresponding analog waveform signal.

3. The direct digital synthesizer of claim 1, wherein:

the means for providing a waveform sample is an addressable memory device having stored therein waveform samples in correspondence with memory device addresses; and the compensated phase signal is supplied as an address to the addressable memory device.

4. The direct digital synthesizer of claim 1, wherein the sequence generating means is an n-bit accumulator, having one input coupled to receive a phase increment signal.

5. A modulator for modulating a carrier signal with a baseband signal, comprising:

means for receiving a stream of complex data values that represent the baseband signal;

means for generating a sequence of n-bit phase signals representing phase of the carrier signal, wherein n is an integer greater than zero, and each n-bit phase signal comprises a phase estimate signal and a phase error signal, the phase estimate signal comprising a most-significant m bits of the n-bit quantity, wherein m is an integer greater than zero and less than n, and the phase-error signal comprising a least-significant n−m bits of the n-bit quantity;

a sigma-delta modulator for generating a compensation signal from the phase error signals, wherein the sigma-delta modulator performs at least second order sigma-delta modulation of the phase error signals;

means for adding the phase estimate signal to the compensation signal and producing therefrom a compensated phase signal;

means, coupled to the adding means, for providing a carrier signal sample in correspondence with the compensated phase signal; and means for performing a complex multiplication between the carrier signal sample and one of the baseband signal complex data values, and generating therefrom a modulated carrier signal sample.

6. The modulator of claim 5, further comprising a digital to analog converter, coupled to receive the modulated carrier signal sample and producing therefrom a corresponding analog modulated carrier signal.

7. The modulator of claim 5, wherein:

the means for providing a carrier signal sample is an addressable memory device having stored therein carrier signal samples in correspondence with memory device addresses; and the compensated phase signal is supplied as an address to the addressable memory device.

8. The modulator of claim 5, wherein the sequence generating means is an n-bit accumulator, having one input coupled to receive a phase increment signal.

9. A method for generating a waveform, comprising the steps of:

generating a sequence of n-bit phase signals representing phase of the waveform, wherein n is an integer greater than zero, and each n-bit phase signal comprises a phase estimate signal and a phase error signal, the phase estimate signal comprising a most-significant m bits of the n-bit quantity, wherein m is an integer greater than zero and less than n, and the phase-error signal comprising a least-significant n−m bits of the n-bit quantity;

using sigma-delta modulation to generate a compensation signal from the phase error signals, wherein the sigma-delta modulation is at least second order sigma-delta modulation;

adding the phase estimate signal to the compensation signal and producing therefrom a compensated phase signal; and using the compensated phase signal to generate a waveform sample.

10. The method of claim 9, further comprising the step of converting the waveform sample into an analog waveform signal.

11. The method of claim 9, wherein the step of using the compensated phase signal to generate a waveform sample comprises the step of applying the compensated phase signal to an address input of an addressable look-up table having stored therein waveform samples in correspondence with look-up table addresses.

12. A method for modulating a carrier signal with a baseband signal, comprising the steps of:

receiving a stream of complex data values that represent the baseband signal;

generating a sequence of n-bit phase signals representing phase of the carrier signal, wherein n is an integer greater than zero, and each n-bit phase signal comprises a phase estimate signal and a phase error signal, the phase estimate signal comprising a most-significant m bits of the n-bit quantity, wherein m is an integer greater than zero and less than n, and the phase-error signal comprising a least-significant n−m bits of the n-bit quantity;

using sigma-delta modulation to generate a compensation signal from the phase error signals, wherein the sigma-delta modulation is at least second order sigma-delta modulation;

adding the phase estimate signal to the compensation signal and producing therefrom a compensated phase signal;

using the compensated phase signal to generate a carrier signal sample; and performing a complex multiplication between the carrier signal sample and one of the baseband signal complex data values, and generating therefrom a modulated carrier signal sample.

13. The method of claim 12, further comprising the step of converting the modulated carrier signal sample into a corresponding analog modulated carrier signal.

14. The method of claim 12, wherein the step of using the compensated phase signal to generate a carrier signal sample comprises the step of applying the compensated phase signal to an address input of an addressable look-up table having stored therein carrier signal samples in correspondence with look-up table addresses.

* * * * *